US006462629B1

(12) United States Patent
Blair et al.

(10) Patent No.: US 6,462,629 B1
(45) Date of Patent: Oct. 8, 2002

(54) ABLATIVE RF CERAMIC BLOCK FILTERS

(75) Inventors: Raymond G. Blair, Albuquerque, NM (US); Edward J. Rombach, Rio Rancho, NM (US); Randel N. Simons, Albuquerque, NM (US); Wayne D. Pasco, Placitas, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/333,716

(22) Filed: Jun. 15, 1999

(51) Int. Cl.[7] .............................................. H01P 1/202
(52) U.S. Cl. ........................................ 333/134; 333/206
(58) Field of Search .............................. 333/134, 202, 333/206, 203, 222, 204

(56) References Cited

U.S. PATENT DOCUMENTS

| 4,742,562 A | * | 5/1988 | Kommrusch ................. 455/78 |
| 4,965,537 A | * | 10/1990 | Kommrusch ................ 333/202 |
| 5,109,536 A | * | 4/1992 | Kommrusch ................ 455/82 |
| 5,162,760 A | | 11/1992 | Phillips et al. ............. 333/206 |
| 5,198,788 A | | 3/1993 | Phillips et al. ............. 333/207 |
| 5,379,011 A | | 1/1995 | Sokola et al. ............... 333/206 |
| 5,602,518 A | * | 2/1997 | Clifford, Jr. et al. ........ 333/202 |
| 5,769,988 A | | 6/1998 | Kagata et al. ................ 156/89 |
| 5,783,978 A | | 7/1998 | Noguchi et al. ............ 333/202 |
| 5,999,070 A | * | 12/1999 | Endo .......................... 333/206 |

FOREIGN PATENT DOCUMENTS

| EP | 0480703 A | 4/1992 |
| EP | 0798803 A | 10/1997 |
| EP | 0865094 A | 9/1998 |

* cited by examiner

*Primary Examiner*—Justin P. Bettendorf
*Assistant Examiner*—Stephen E. Jones
(74) *Attorney, Agent, or Firm*—Alfred E. Hall; Steven Weseman (57) ABSTRACT

A method of forming metallization patterns on a block of dielectric material wherein the entire surface area of the dielectric block is encased with a conductive material and unwanted conductive metal is ablatively etched from a designated surface area of the dielectric block to form desired metallized circuit patterns.

The invention also comprises a filter and a duplexer formed by the method of the present invention.

15 Claims, 5 Drawing Sheets

ABLATIVE RF CERAMIC BLOCK FILTERS

BACKGROUND OF THE INVENTION

1. Field of the Invention

This invention relates generally to electrical filters and relates particularly to filter apparatus and a method of forming so-called ceramic filters and duplexers.

2. Description of Related Art Including Information

RF ceramic filters are well known in the art. They are constructed of blocks of ceramic material that are typically coupled to other electronic circuitry through discrete wires, cables, and pins coupled to conductive connection points on external surfaces of the blocks. They are also used to construct duplexers and other electronic components.

Ceramic block filters are used in wireless communication products. Three major process steps in the manufacture of these filters are: (1) the capacitive element pattern generation, (2) I/O pad generation, and (3) tuning the filter to the proper operating frequency. The function of the capacitive element pattern on the filter is to approximate the RF response required by the customer. The function of the I/O pad generation operation is to provide the interface from the filter to the wireless communication product. The function of the tuning operation is to finally adjust this approximated RF response to meet the exact customer requirements for the desired response.

In the prior art, a ceramic block is sintered and then silver metallic paste is placed on all sides of the block EXCEPT for those sides that require a defined electrical circuit such as a capacitive element pattern or input/output (I/O) pads. On those sides, the silver metallic paste is applied to the ceramic block in the form and shape of the desired pattern and the I/O pads (through a well-known screen print process technology or abrasion technology). A heating process causes the metallic paste to solidify with the pattern(s) and/or I/O pads generally in their proper location.

However, this screen print process does not have the dimensional accuracy desired in the plating of the capacitive element filter pattern and other filter elements. The capacitive element filter pattern dimensional accuracy on the ceramic block filters is required to be four times (4x) as accurate at 1.8 GHz as at 900 MHz.

Thus, in order to complete the product, the capacitive element filter pattern must be further tuned to meet exact customer specifications. This can be accomplished by adding excess metallic paste adjacent circuit pattern features and then using some method to sinter the metallic paste, forming an integral addition to the pattern or pads or, in some cases, material can be removed for tuning. By applying a signal to the input and monitoring the output signal during this process, the operator can terminate the addition of material to the pads or terminals when the output signal indicates that proper tuning has been achieved.

Thus, in U.S. Pat. No. 5,198,788 fine tuning of ceramic filter metallic terminals or pads is disclosed. In this patent, the ceramic block is coated on all sides but one (and perhaps a portion of an adjacent side) and on the uncoated side (and portion), silver metallic paste is formed in the general shape of the desired electronic terminals, pattern, or pads. The silver metallic paste is heat-treated to form a rigid coating. Additional silver metallic paste is then placed adjacent and electrically contacting the formed terminals or pads and, while an input signal is being monitored on the output terminal, a laser beam is used to scan the silver metallic paste to sinter it and form a solid addition to the terminal or pad until the proper electrical characteristics of the device is obtained. Thus, this patent relates to the addition of metal to the already generally formed terminals, pattern, or pads to tune the circuit.

In U.S. Pat. No. 5,769,988 there is disclosed a method of manufacturing a ceramic electronic component having a dielectric ceramic and a conductor thereon containing silver as the main component. By heat-treating the device, such as a dielectric resonator formed with that process, the "Q" value of the resonator is increased. In the process of heat-treating the device, it is disclosed that the device is subjected to a heat treatment at 400° C. or more in an atmosphere containing 10% or less by volume of oxygen. Further, Kagata, et al ('988) disclose "forming the conductive paste . . . in a pattern of electrodes" on the sintered dielectric ceramic substrate.

U.S. Pat. No. 5,162,760 also relates to electrical filters formed of ceramic blocks using abrasive or miling methods to remove metallization or use various screen-printing techniques to apply conductive materials onto the various surfaces of the ceramic blocks. In the '760 patent, a layer of conductive material is deposited on the surface of the block and after the layer is successfully cured, portions of the conductive layer are removed by any suitable milling machine such that the desired conductive pattern is left on the surface. Both the conductive material coating the block and the dielectric material are removed from the block in the areas that are milled. This device is limited in accuracy or precision by the electrode dimension that can be formed with a milling machine.

In U.S. Pat. No. 5,379,011 there is described a ceramic band-pass filter with improved input/output isolation and having conductive material removed from the metallization of the block and the I/O pads are deposited in those areas where the conductive metal had been removed. Again, in this patent, all six sides of the ceramic block are metallized with the exception of the top or upper surface and a portion of the side surface. Slots are formed, between the deposited input/output pads and adjacent metal in the ceramic material and thus, when not plated, varies the dielectric between the input/output pads.

It would be desirable to have such a filter with good isolation between conductive areas and having greater dimensional accuracy of the filter pattern and I/O pads than the present art can provide.

U.S. Pat. No. 5,602,518, assigned to the assignee of the present invention, discloses a ceramic block filter having five sides completely metallized and one side completely unmetallized (side 110 in FIG. 1). However, the '518 patent differs from the present invention in that the channels (108 in FIG. 1) are completely metallized and serve the purpose of increasing the magnetic coupling between resonators. On the contrary, the trenches of the present invention are not metallized and serve the purpose of allowing adjacent metallized areas to be capacitively coupled.

SUMMARY OF THE INVENTION

In the present process, the ceramic block is formed in the usual manner. It has at least one planar surface. Then, instead of coating only those sides where the pattern or I/O pads are not to be formed, the ENTIRE ceramic block is coated with a conductive metallic material. One example of such metallic coating is a paste well known in the prior art and containing an electrically conductive metal (such as silver, for example only) and is then subjected to the necessary heat treatment to solidify the metal. Other examples of conductive coatings include plating the ceramic blocks with a conductive metal and the like.

An ablative method, such as the use of a scanning laser beam, is used to remove unwanted metallic material from at least one planar surface to form the desired capacitive element filter patterns. This differs from the abrasive method of the prior art or the screen printing of the prior art. The laser beam ablates both the metallization and a portion of the ceramic block to form trenches that surround metallic filter components and create the pattern in the desired shape. The depth and width of the trenches determine coupling capacitance of the filter and thus determine its operating frequency. The precision and repeatability of forming the trenches with the lasing process allows greater accuracy and repeatability of the capacitive element filter pattern and the other filter components. The more precise patterns allow for higher tune rates, higher factory yields, and more design margin for the product designers.

However, a well-known problem occurs as a result of the ablation process. During the lasing process, the ceramic material is adversely affected and the "Q" of the ceramic material is reduced to a point where the filter has no commercial value. Therefore a post-lasing, high-temperature heating process is required to restore the ceramic "Q" back to its approximate original value.

Since, during the ablation process, the capacitive element patterns and other filter components are being formed, a signal cannot be connected to the input pad for monitoring at the output pad to see if the capacitive element patterns and the other filter components being formed are of the correct dimensions. After the filters have been formed, such signals cannot be applied and measured to the product specification because the ceramic block has such a reduced "Q" that they are only a generalized representation of the signals that would be found in a finished product. Therefore, for a given product specification, a trial-and-error ablation process is used by continuing to make metallized blocks with different dimension conductive patterns until signals representing the proper RF response range have been established to form a "reference" ceramic block. Since the lasing process is extremely precise and repeatable, great numbers of the reference device can then be produced and then a high temperature heating process is used to provide the proper RF response once the appropriate patterns have been generated.

Thus, it is an object of the present invention to provide a method of forming electrically conductive metallization patterns on a ceramic block that are electrically isolated from each other by a pattern of dielectric material.

It is still further an object of the present invention to provide a ceramic block that has its entire surface coated with a conductive material and to use a scanning laser beam to ablatively etch unwanted metallic material and corresponding ceramic material from the ceramic block and create trenches that form at least a portion of the pattern of dielectric material that establishes the desired metallization pattern.

It is also an object of the present invention to ablatively etch unwanted metallic material in such a way that a portion of the ceramic block is also removed sufficient to form trenches that electrically isolate adjacent metallic areas formed by the ablative etching.

It is another object of the present invention to ablatively etch unwanted metallic material from a designated surface area of the ceramic block to form trenches of dielectric material that create a desired metallization pattern, including input and output terminals.

It is still another object of the present invention to apply test signals to the input terminal of a post-lased, pre-heated ceramic filter and to monitor the output signal to determine by trial and error when a filter having the desired electrical characteristics is obtained.

It is yet another object of the present invention to heat the ablatively-etched ceramic block in an ambient atmosphere to restore the "Q" of the ceramic material.

Thus, the present invention relates to a method of forming ceramic block metallization patterns comprising the steps of encasing the entire surface of a ceramic block, including at least one planar surface, with a conductive metal, such as a metallic paste, for example only, solidifying the conductive metallic paste into a metallic material, and ablatively etching unwanted metallic material from a designated surface area of the ceramic block to form a desired metallization pattern, including input and output terminals if desired.

The invention also relates to a method of forming RF ceramic block filters comprising the steps of encasing the entire external surface area of a ceramic block with a conductive metallic material, using a pattern of dielectric material to electrically isolate and form electrically conductive circuit elements on the encased ceramic block, ablatively etching unwanted metallic material and a portion of the ceramic block from a designated surface area of the encased ceramic block to form at least one trench that forms at least a portion of the pattern of dielectric material and heating the ablatively-etched ceramic block to increase the "Q" thereof.

The invention also relates to trench filters and duplexers in which each conductive element formed in a ceramic block whose entire surface is encased in a conductive material, each of the conductive elements being at least partially surrounded by a trench or recessed area extending through the conductive material and into the ceramic block, the recessed area having a predetermined depth and width to affect the coupling capacitance of the filter or duplexer and thus control an operating characteristic of said filter or duplexer.

BRIEF DESCRIPTION OF THE DRAWINGS

These and other features of the present invention will be more fully disclosed when taken in conjunction with the following Detailed Description of the Preferred Embodiment(s) in which like numerals represent like elements and in which.

DETAILED DESCRIPTION OF THE PREFERRED EMBODIMENT(S)

Figures 1, 2:
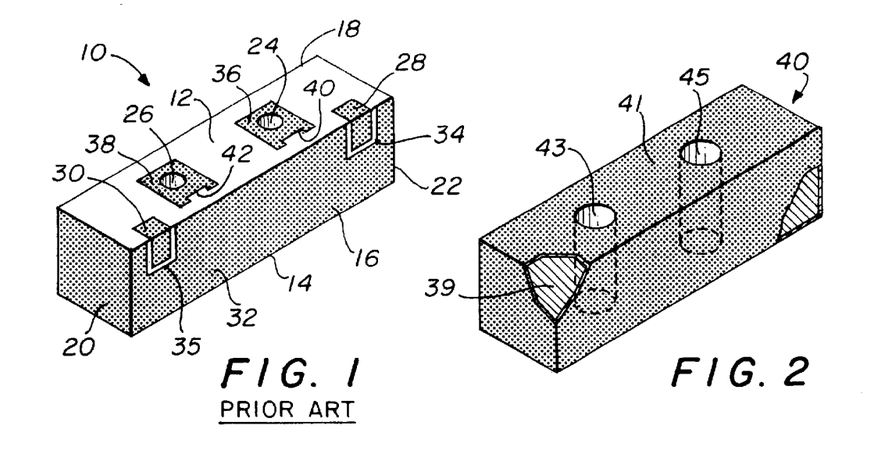
FIG. 1 is a perspective view of a prior art ceramic band-pass filter adapted for tuning by adding material thereto.
FIG. 2 is a perspective view of a ceramic block of the present invention entirely encased with an electrically-conductive material such as a metallic paste.

FIG. 1 is a perspective view of a prior art ceramic band-pass filter. Filter 10 is formed of a ceramic block with some surfaces having a conductive metal plate thereon and includes a top face 12, a bottom face 14, side faces 16 and 18, and end faces 20 and 22. Filter 10 further comprises parallel cylindrical bores 24 and 26 that openly extend between top face 12 and bottom face 14. Regions of the ceramic block surfaces, such as top surface or face 12, are screen-printed, in a well-known manner, with conductive metal material such as a silver paste to form metallic elements of the filter leaving the bare ceramic surface material of the ceramic block between the filter elements. The printed elements 36 and 38 rise above the top face of planar surface 12 of the ceramic block and include an input pad 28 and an output pad 30 that may wrap around between top face 12 and side face 16. The wraparound configuration is particularly adapted for surface-mount connections when a filter is subsequently incorporated into an electronic package. The side faces 16 and 18, bottom face 14, and end faces 20 and 22 are covered with a continuous metal plate that forms a ground element 32. At face 16, ground plate 32 is separated from input pad 28 and output pad 30 by bare ceramic regions 34 and 35 to prevent electrical short-circuiting. These bare ceramic regions 34 and 35 are created when the I/O pads are screen-printed on the ceramic substrates. Through-holes 24 and 26 are coated with conductive metal that extends onto the top face 12 to include the resonator pads 36 and 38 that are surrounded by bare ceramic surface. In accordance with the prior art, pads 36 and 38 include notches 40 and 42 for tuning the filter.

The prior art filter as shown in FIG. 1 has a thick film of metallic paste applied to the major surfaces, except for faces 12 and 16 and also to through-holes or cavities 24 and 26 by spraying, screen-printing, or other well-known process. The film of conductive paste is screen-printed in the desired pattern onto top surface 12 and side surface 16. The filter can be tuned as described more fully in U.S. Pat. No. 5,198,788.

Thus, in the prior art, a ceramic block is sintered and then silver metallic paste is placed on all sides of the block except for those sides that require a defined capacitive element pattern or input/output (I/O) pads. On those sides, the silver metallic paste is applied to the ceramic block in the form and shape of the desired pattern and pads (through a well-known screen-print process technology) thus forming conductive surfaces that are above the planar surface 12 of the ceramic block. A heating process causes the metallic paste to solidify with the patterns and/or I/O pads generally in their proper locations. However, this screen-print process does not have the dimensional accuracy desired in the plating of the capacitive element filter pattern. The capacitive element filter pattern dimensional accuracy on the ceramic block filters is required to be four times greater (4x) at 1.8 GHz as required at 900 MHz. The dimensional accuracy of the screen-printing process is capable of producing acceptable 900 MHz filters. However, above 900 MHz, the frequency response continually degrades thereby producing smaller and smaller numbers or quantities of filters having an acceptable frequency response. Therefore, in order to complete the product, the capacitive element filter pattern must be further tuned to meet exact customer specifications. This can be accomplished by adding excess metallic paste to adjacent pattern features (e.g. slots 40 and 42 in FIG. 1) and then using some method to sinter the metallic paste, thus forming an integral addition of metal to the pattern or pads. By applying a signal to the input terminal and monitoring the output signal at the output terminal, the operator can cease the addition of material to the pads or terminals when the output signal indicates that proper tuning has been achieved. See U.S. Pat. No. 5,198,788 incorporated herein by reference.

Figures 3, 4:
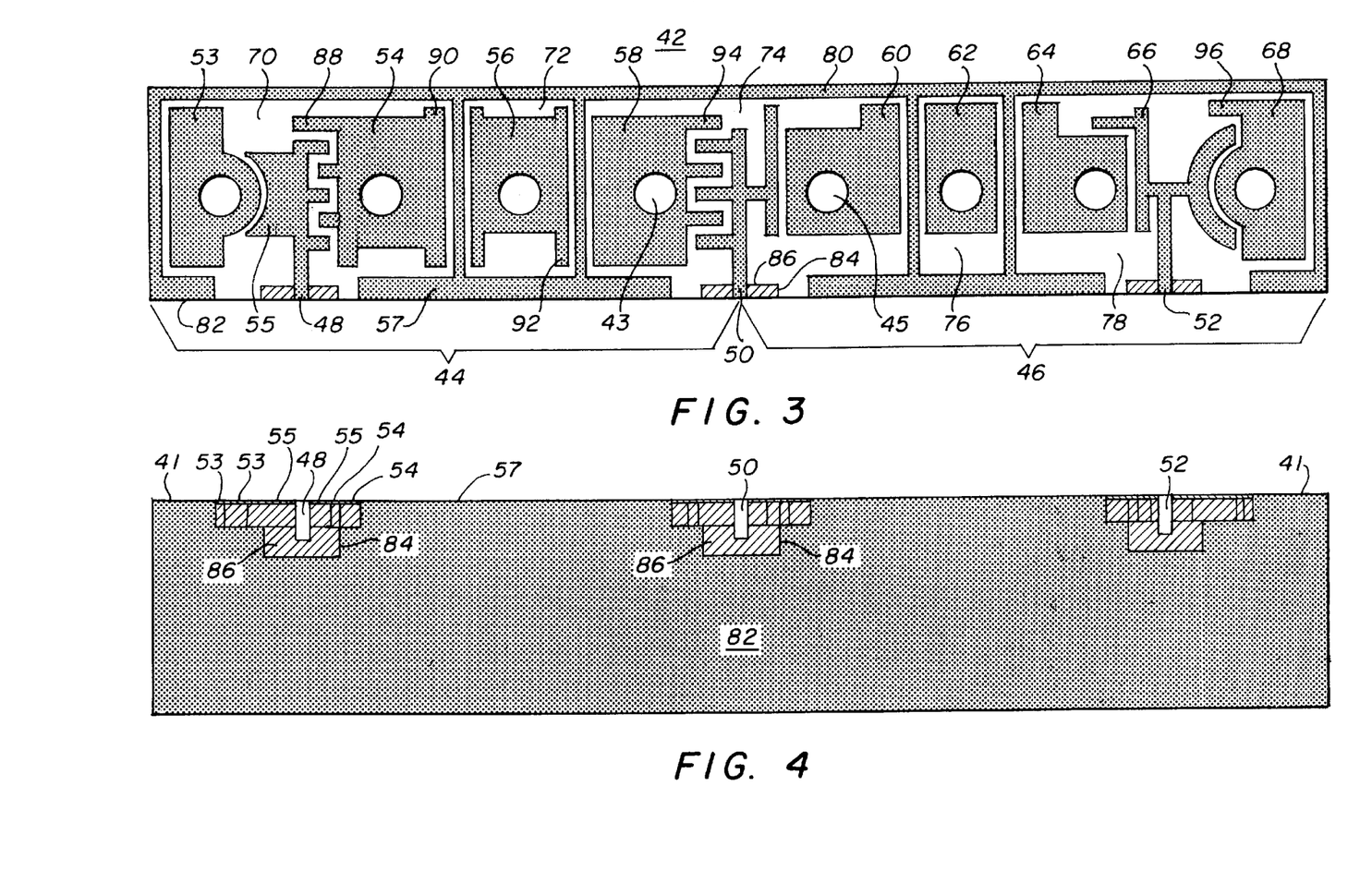
FIG. 3 is a top view of a duplexer formed by the method of the present invention.
FIG. 4 is a side view of the duplexer of FIG. 3 illustrating the conducting pads or terminals formed thereon and the trenches formed around the conductive filter elements.

FIG. 2 illustrates a perspective view of a ceramic block of the present invention entirely encased with a conductive metal. The conductive metal may be plated thereon or may be formed with an electrically-conductive metallic paste that has been heated to solidify it. The block 40 has an internal ceramic portion 39 entirely encased, on all of its outside surfaces, including capacitive adjusting through-holes 43 and 45, with the conductive metal. Only two through-holes are shown but, obviously, more can be included as shown in FIG. 3. Thus, instead of coating all sides except for the sides where the pattern or I/O pads are to be formed, the entire ceramic block is encased with a conductive metal such as, for example only, an electrically-conductive metallic paste (well known in the art) that is subjected to the heat treatment to solidify the metal.

A duplexer 42 using filters formed with the process of the present invention is illustrated in FIG. 3. It comprises a transmitter portion 44 and a receiver portion 46. It includes an I/O pad 48 for the transmitter (not shown), an antenna pad 50 for coupling signals to and from the transmitter portion 44 and the receiver portion 46, and an I/O pad 52 for connecting signals to the receiver (not shown). The transmitter portion 44 of the duplexer 42 includes resonators and associated circuit elements 53, 54, 55, 56, and 58 while the receiver portion 46 uses resonators and associated elements 60, 62, 64, 66, and 68. FIG. 3, before the circuit elements are formed thereon, looks like the block in FIG. 2 and the upper surface 41 has metal and corresponding ceramic ablatively removed therefrom to provide a pattern of dielectric material that forms, and electrically isolates, the circuit elements 53, 54, 55, 56, 58, 60, 62, 64, 66, and 68. It should be noted that the term "electrically isolates" as used herein means "no direct electrical connection". That is, there no longer is electrical continuity or connection between "isolated" conductive elements. There may be, however, electrical "coupling" between adjacent elements by means of electromechanical coupling (a piezoelectric effect) or alternating current (AC) coupling as through a capacitive effect. Note that in areas 70, 72, 74, and 78 that the metal and a corresponding portion of the ceramic material have been removed by an ablative process. This ablative process, preferably performed with a scanning laser beam, removes not only the conductive metal but also a corresponding portion of the dielectric block to form "trenches" or recessed areas 70, 72, 74, 76, and 78. These trenches have a depth and a width in any given portion of the filter pattern that affects the coupling capacitance between adjacent metallic surfaces in a well-known manner and thereby affects electrical characteristics of the filters such as frequency of operation and impedance. Of course, if desired, some of the conductive elements could be formed by the prior art method of screen-printing and the outer edges thereof trimmed by a laser beam according to the present invention, to accurately control the conductive elements. The remainder of the patterns of dielectric material could be formed by the present novel process. In such cases, however, the trench forms at least 10%, and preferably in the range of about 70% to about 90%, of the pattern of dielectric material electrically isolating the electrical circuit pattern elements.

Thus, for the duplexer 42 shown in FIG. 3, it is formed from a block of dielectric material having multiple surfaces including at least one planar surface such as the block illustrated in FIG. 2. It also has a layer of metallic material coating all sides of the multiple surfaces of the block of dielectric material also as shown in FIG. 2. A ground plane 80 is formed by at least some of the metallic surfaces as illustrated in FIG. 3 by conductive material 82. A receiver filter 46 is formed in a first area of at least one planar surface of the block of dielectric and includes a first plurality of conductive elements 60, 62, 64, 66, and 68. A trench or recessed area 74, 76, and 78 surrounds each of the conductive elements to electrically isolate them and is recessed to a predetermined depth and has a predetermined width to cause a capacitive coupling between the conductive elements and the ground plane that determines an operating characteristic of the receiver filter such as the operating frequency.

In like manner, the transmitter filter 44 is formed on a second different area of the at least one planar surface of the dielectric block shown in FIG. 2 and includes a second plurality of conductive elements 53, 54, 55, 56, and 58 that has the trenches 70, 72, and 74 that surround each of the plurality of conductive elements forming the transmitter portion 44. Again, these trenches are ablatively removed and extend through the conductive metallic material and into the dielectric material. Thus, a second capacitive coupling is formed between the conductive elements of the transmitter 44 and the ground plane that, again, provides a capacitive coupling that is determined by the depth and width of the trenches or recessed areas and determine the operating frequency of the transmitter filter. First and second terminals 48 and 52 for the transmitter and the receiver, respectively, are formed on the top and side of the coated dielectric block such as shown as in FIG. 1 and in FIGS. 3 and 4. A third terminal 50 receives an antenna connection and is electrically coupled to the receiver filter and the transmitter filter in a well-known manner. It conveys the RF signals between the antenna and the RF receiver and the RF transmitter.

One or more through-holes such as 43 and 45, well known in the prior art, are plated with conductive matter to create resonate circuit elements.

If it is desired to fine-tune the filter, metal can be ablatively removed from areas such as, for example only, 88, 90, 92, and 94 to fne-tune the transmitter. The receiver 46 can be tuned in like manner. In this case, again, the ablative etching will remove both the metal plate and the ceramic to a desired depth.

FIG. 4 is a side view of the duplexer of FIG. 3. All of the elements shown therein are enlarged and not to any proportion. However, it can be seen in FIG. 4 that on the side 82 the transmitter terminal 48 extends down the side of the block and an area of conductive metal 82, shown at 84, is removed from around the terminal 48 thus exposing the ceramic 86. In like manner, the conductive elements 53, 54, 55, 57, and 58 shown on top of the ceramic have been formed by the creation of the trenches or recesses as set forth in the discussion of FIG. 3.

The same construction can be shown in relation to the third terminal 50 and the second terminal 52.

The important matter to consider here is that the block has been entirely coated with a conductive metal and that the patterns have been formed on the surface by ablatively etching away unwanted material to a desired depth and width to provide the proper operating characteristics of the filter. It will be noted in FIG. 4 that the surfaces of the conductive elements are at the same elevation as the surface 41 of FIG. 2 and FIG. 4. In other words, there is no formation of conductive elements on top of the ceramic but rather a deletion of metal as well as of the ceramic block by using the ablative method. This is entirely different from the prior art filter elements formed on top of and above the surface of the dielectric block and the terminals on the side of the block are formed by screen printing.

As stated earlier, however, a portion of the conductive metallic material may be formed, as in the prior art, with screen printing and then the remainder of the conductive metallic circuit patterns may be formed by the ablative etching as heretofore described.

Figure 5:
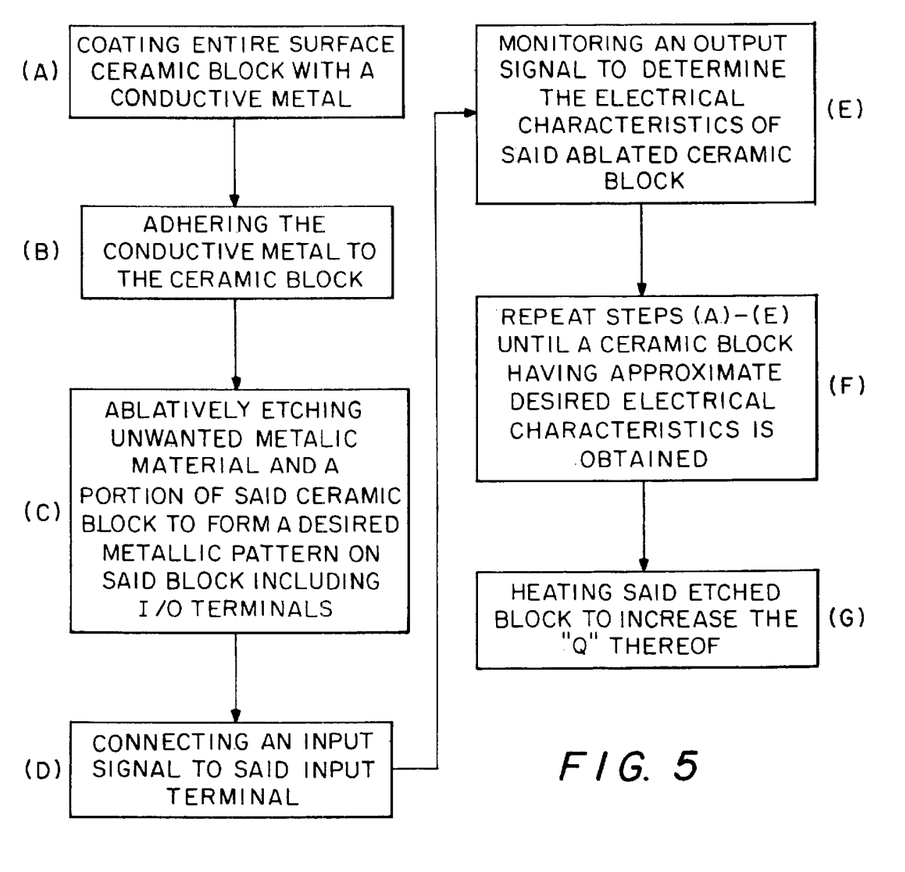
FIG. 5 is a flow diagram illustrating the novel steps of the present invention.

FIG. 5 discloses a flow chart illustrating the novel steps of the present invention. At step (A), the entire surface of the ceramic block is coated with a conductive metal, preferably a metallic paste. At step (B), the conductive metal is solidified into a metallic material such as by heating the metallic paste and to cause it to adhere to the corresponding ceramic block. At step (C), unwanted metallic material and a portion of the corresponding ceramic block is ablatively etched away to form the desired metallic pattern on the block including I/O terminals. Of course, I/O terminals could be added on the side by some other method, such as screen printing as explained earlier and could then be electrically coupled to the metallic patterns that are formed on the top surface by ablatively etching.

At steps (D) and (E), the prototype filter is electrically checked. At step (D), an input signal is connected to the input terminal and, at step (E), an output signal at the output terminal is monitored to determine the electrical characteristic of the ablated ceramic block.

At step (F), steps (A) through (E) are repeated until a ceramic block having approximate desired electrical characteristics is obtained. At that time, the ceramic block filters can be mass-manufactured and, at step (G), heated in an ambient atmosphere to increase the "Q" thereof Of course, an ablated ceramic block could be heated to restore the "Q" and then, if the proper filter response is found, the ceramic block filters could be mass-manufactured, heated, and quality control provided to ensure filters having the desired characteristics.

Figure 6:
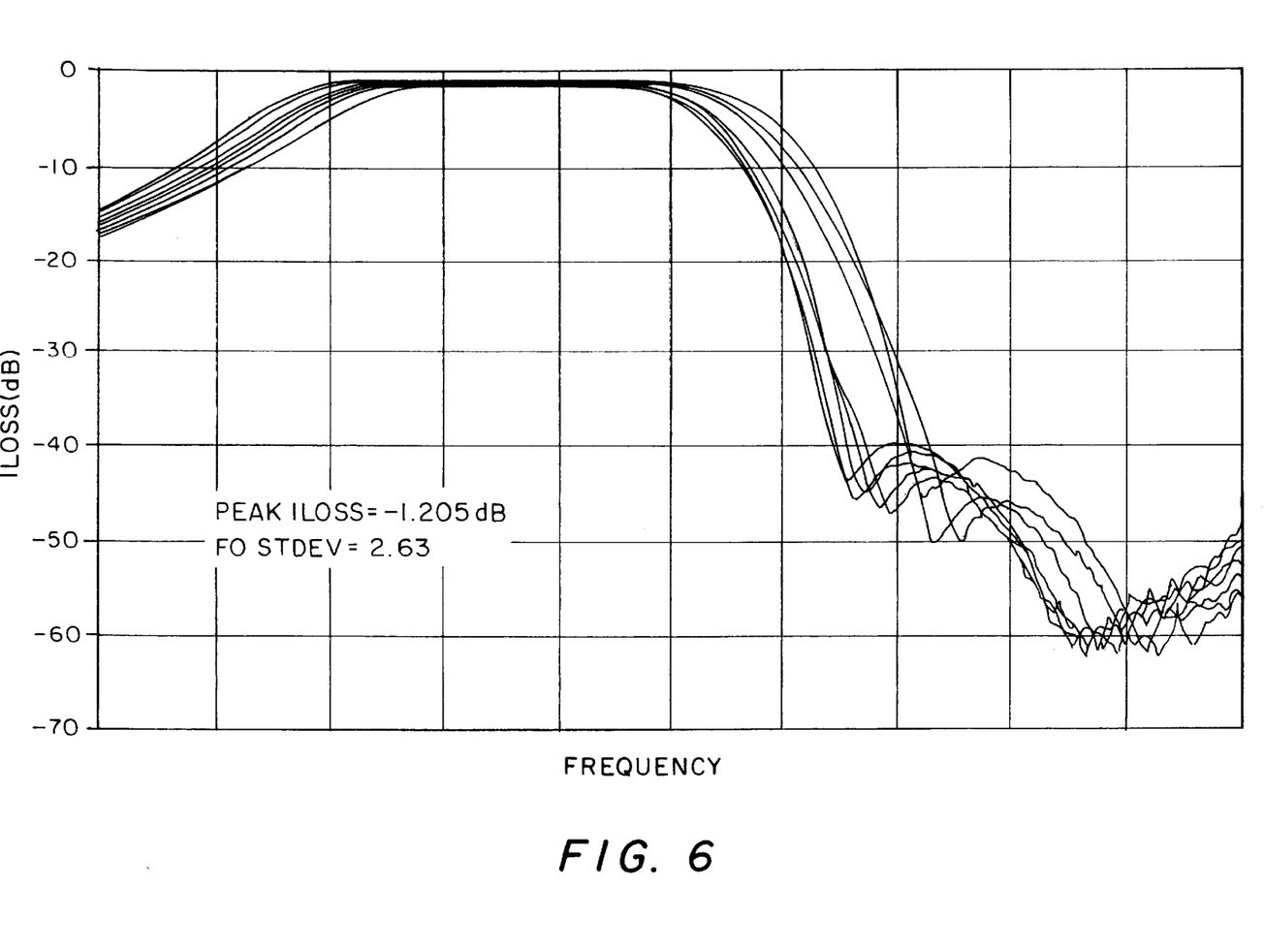
FIG. 6 is a graph illustrating the frequency response of a plurality of prior art filters shown in FIG. 1.

FIG. 6 is a graph of the frequency response of a plurality of filters formed with the prior art process of printing the circuit on the ceramic block surface. Note that the peak insertion loss is -1.2 dB and the frequency standard deviation is 2.63 MHz. It can be seen that on each end of the curve that there is a great deal of variation and response among the filters, thus changing the bandwidth of the devices.

Figure 7:
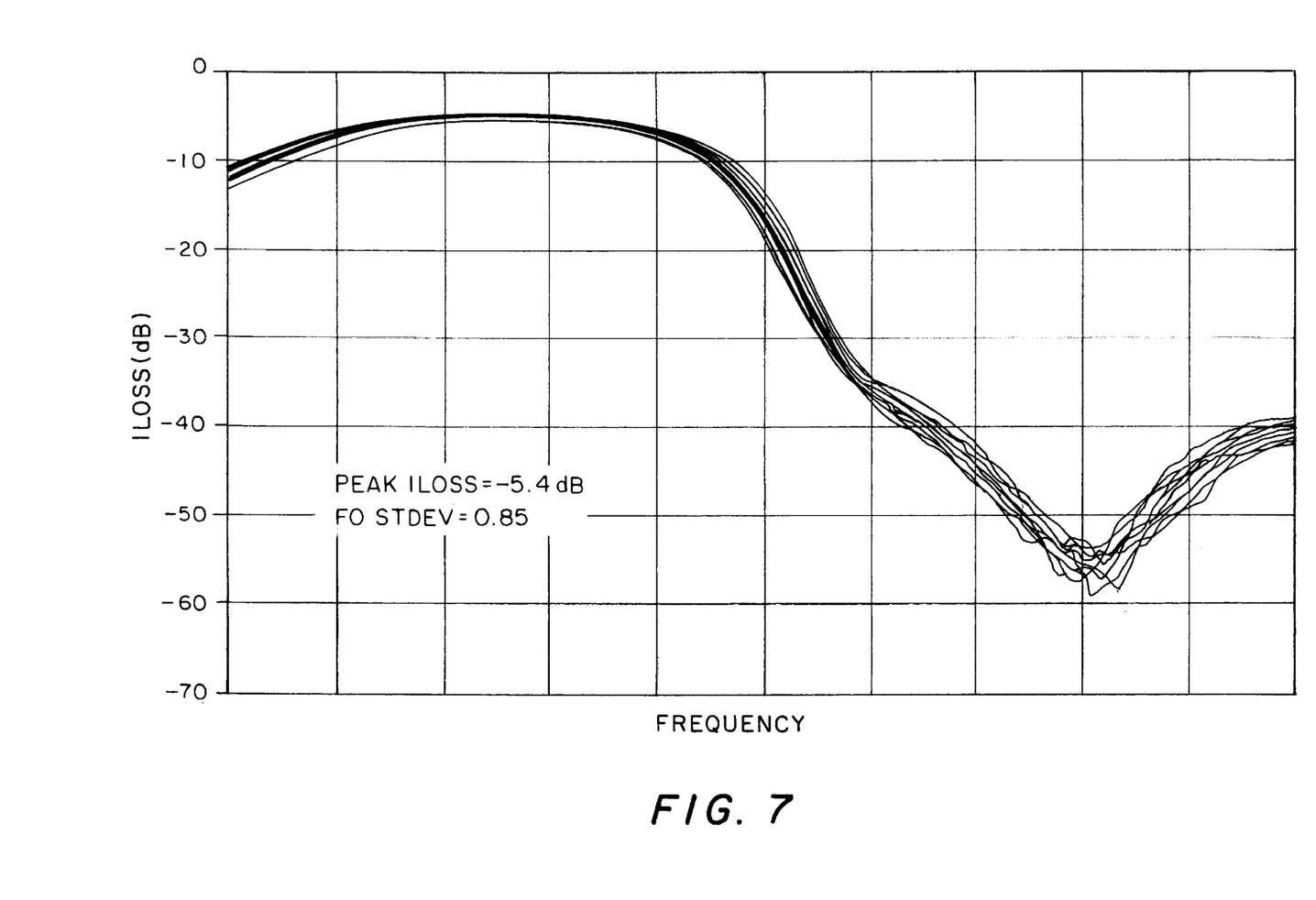
FIG. 7 is a graph illustrating the frequency response of a plurality of filters formed by the present inventive process after lasing but before high temperature heat processing.

FIG. 7 is a graph of a plurality of filters made with the novel method of the present invention. Note how closely they all respond all across the graph and especially across the bandwidth at the top. This graph illustrates the frequency response of a plurality of the devices after the lasing process to create the filter circuit elements but before they have been heated to restore the "Q". Therefore, notice that the peak insertion loss is 5.4 dB. However, the center frequency deviation has been reduced to 0.85 MHz.

Figure 8:
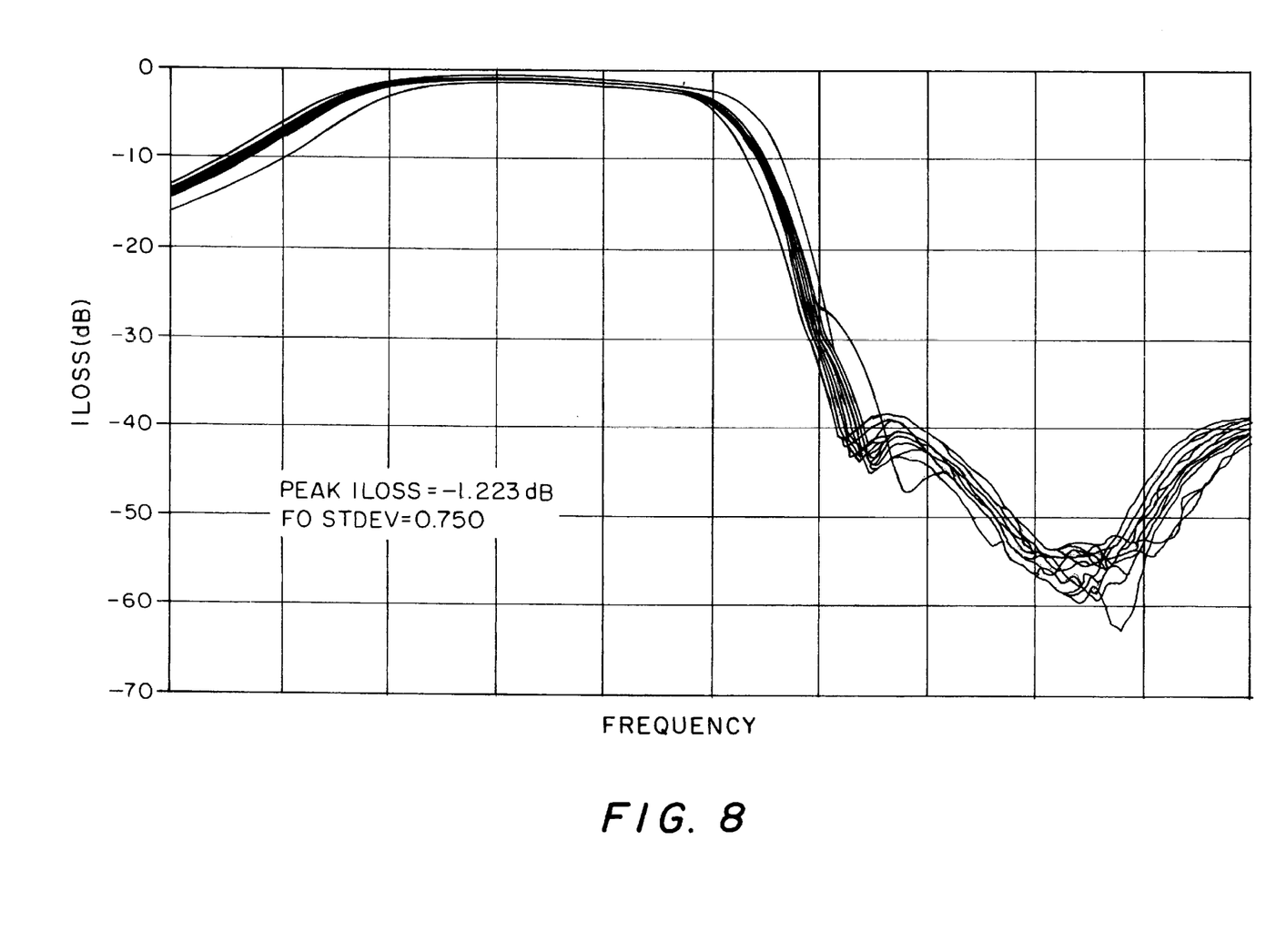
FIG. 8 is a graph illustrating the frequency response of a plurality of filters formed by the present inventive process after firing to restore the "Q" of the ceramic.

FIG. 8 is a graph of the same ceramic filters made with the process of the present invention and shown in FIG. 7 after they have been heated to restore the "Q". Again, notice how closely they replicate each other and the peak insertion loss has now been reduced to -1.2 dB and center frequency standard deviation is 0.75 MMz.

Thus, it can be seen there is a significant improvement in the operation of the filters made under the process of the present invention.

Thus, there has been disclosed a novel process and apparatus in which process two major steps are included.

The first is that all of the surfaces of the ceramic block are covered with plated metal and, second, that at least some of the desired filter circuit patterns are formed by ablatively etching unwanted materials from one or a portion of a second surface of the plated ceramic block ablating both the metal and underlying ceramic.

The first novel step differs from the prior art in that in the prior art one or more surfaces are left uncoated and then the patterns are plated thereon, thus the patterns have a top surface that rises above the top surface of the ceramic block. In the present application, because the metal surfaces of the patterns formed are coplanar with the other metal surface that was not removed on the block tuning simply requires removing additional metal from the metal circuit patterns. Further, the ablative technique used to remove the metal also removes a portion of the dielectric, thus creating a trench or recessed area around each of the conductive elements of the filter circuit pattern to electrically isolate them. The width and depth of these recessed areas determine the operating parameters of the filter such as the operating frequency.

The second step of ablatively etching away unwanted material and dielectric not only to form the metal filter circuit patterns but also to determine the frequency response of the filter is novel since, in the prior art, a laser was used only to add metal to tune the filter circuits.

The corresponding structures, materials, acts, and equivalents of all means or step plus function elements in the claims below are intended to include any structure, material, or act for performing the function in combination with other claimed elements as specifically claimed.

What is claimed is:

1. An electric communication signal filter comprising:
    a block of dielectric material having an outside surface including a top surface, a bottom surface, and at least first and second side surfaces, said block defining a plurality of through-holes, each through-hole extending from an opening in said bottom surface to an opening in said top surface, a metallization pattern on said outside surface, said metallization pattern being formed of a plurality of unmetallized recessed areas and a plurality of metallized areas and wherein said metallization pattern extends over portions of said top surface and portions of at least one of said bottom surface, said first side surface and said second side surface.

2. An RF filter comprising:
    a block of dielectric material having multiple outside surfaces including at least one planar surface bound by at least first and second side surfaces;
    a layer of electrically conductive material adhered to all of the multiple surfaces of said block of dielectric material;
    a ground plane formed by at least one of said electrically conductive surfaces;
    an electrical filter circuit pattern of multiple conductive elements spaced apart from one another and being formed in said layer of electrically conductive material on at least said one planar surface,
    wherein said circuit pattern comprises:
        recessed areas recessed into corresponding dielectric material, said recessed areas having a predetermined shape determining the coupling capacitance between said conductive elements and said ground planes, said coupling capacitance determining an operating characteristic of said filter and wherein at least one of said recessed areas extends over portions of at least two of said outside surfaces.

3. An RF filter comprising:
    a block of dielectric material having six substantially planar outside surfaces including at least one planar surface bound by at least first and second side surfaces;
    a layer of electrically conductive material adhered to all of the multiple surfaces of said block of dielectric material;
    a ground plane formed by at least one of said electrically conductive surfaces;
    an electrical filter circuit pattern of multiple conductive elements spaced-apart from one-another and being formed in said layer of electrically conductive material on at least said one planar surface;
    wherein said circuit pattern comprises:
        recessed areas recessed into corresponding dielectric material, said recessed areas having a predetermined shape determining the coupling capacitance between said conductive elements and said ground plane, said coupling capacitance determining an operating characteristic of said filter and wherein none of said recessed areas extend over the combination of said at least one planar surface and both said first side surface and said second side surface, but at least one of said recessed areas extends over two of said planar outside surfaces.

4. The RF filter of claim 3 wherein said recessed areas are formed by ablatively removing said conductive material and corresponding dielectric material to said predetermined depths and widths.

5. An electric communication signal filter comprising:
    a block of dielectric material having an outside surface including a top surface, a bottom surface, and at least first and second side surfaces, said block defining a plurality of through-holes, each through-hole extending from an opening in said bottom surface to an opening in said top surface, said block further defining a recessed area pattern on said top surface, the recessed area pattern being recessed into the block of dielectric material, wherein said recessed area pattern extends over portions of at least two surfaces of said top surface, said bottom surface, and said side surfaces;
    a layer of electrically conductive material adhered to substantially all of said outside surface of said block except for said recessed area pattern,
    said recessed area pattern and said layer of electrically conductive material together forming a metallization pattern on said top surface of said block, said metallization pattern including an input electrode and an output electrode.

6. The filter of claim 5 wherein said recessed area pattern includes recessed areas on said top surface substantially surrounding each said opening in said top surface.

7. The filter of claim 5 wherein said input electrode and said output electrode each extend from said top surface to said first side surface.

8. The filter of claim 5 having an operating pass band above 900 MHz.

9. An electric communication signal filter comprising:
    a block of dielectric material having an outside surface including a top surface, a bottom surface, and at least first and second side surfaces, said block defining a plurality of through-holes, each through-hole extending from an opening in said bottom surface to an opening in said top surface, said block further defining a recessed area pattern on said top surface, the recessed area pattern being recessed into the block of dielectric material, wherein said recessed area pattern does not extend over the combination of said top surface and both said first side surface and said second side surface, but wherein said recessed area pattern extends over portions of said top surface and portions of said first side surface;

a layer of electrically conductive material adhered to substantially all of said outside surface of said block except for said recessed area pattern, said recessed area pattern and said layer of electrically conductive material together forming a metallization pattern on said top surface of said block, said metallization pattern including an input electrode and an output electrode.

10. An electric communication signal filter comprising:

a block of dielectric material having an outside surface including a top surface, a bottom surface, and at least first and second side surfaces, said block defining a plurality of through-holes, each through-hole extending from an opening in said bottom surface to an opening in said top surface, an ablation pattern on said outside surface dividing said outside surface into a plurality of recessed areas and a plurality of raised areas, each recessed area being recessed into the block of dielectric material and wherein at least one of said plurality of recessed areas extends over portions of at least two surfaces of said top surface, said bottom surface, and said side surfaces;

a layer of electrically conductive material adhered to substantially all of said plurality of raised areas;

said plurality of recessed areas and said plurality of raised areas together forming a metallization pattern on said top surface of said block, said metallization pattern including an input electrode and an output electrode.

11. The filter of claim 10 wherein said input electrode and said output electrode each extend from said top surface to said at least one side surface.

12. An electric communication signal filter comprising:

a block of dielectric material having an outside surface including a top surface, a bottom surface, and at least first and second side surfaces, said block defining a plurality of through-holes, each through-hole extending from an opening in said bottom surface to an opening in said top surface, an ablation pattern on said outside surface dividing said outside surface into a plurality of recessed areas and a plurality of raised areas, each recessed area being recessed into the block of dielectric material and wherein none of said plurality of recessed areas extends over the combination of said top surface and both said first side surface and said second side surface, but wherein at least one of said plurality of recessed areas extends over portions of said top surface and portions of said first side surface;

a layer of electrically conductive material adhered to substantially all of said plurality of raised areas;

said plurality of recessed areas and said plurality of raised areas together forming a metallization pattern on said top surface of said block, said metallization pattern including an input electrode and an output electrode.

13. An antenna duplexer for an RF receiver/transmitter unit, the duplexer comprising:

a solid block of dielectric material having six substantially planar outside surfaces:
 an isolated antenna electrode on said solid block;
 an isolated input electrode on said block spaced apart from the antenna electrode along a length of said block;

a first group of through-hole resonators extending from said antenna electrode to said input electrode;

an isolated output electrode on said block spaced apart from the antenna electrode along a length of said block;

a second group of through-hole resonators extending from said antenna electrode to said output electrode;

a local ground conductive layer on said block; and an electrode metallization pattern on said block, said metallization pattern being formed of a plurality of unmetallized recessed areas and a plurality of raised metallized areas and wherein said metallization pattern extends over portions of two of said substantially planar outside surfaces.

14. The antenna duplexer of claim 13 wherein said metallization pattern includes recessed areas circumscribing each said through-hole resonator.

15. An antenna duplexer for an RF receiver/transmitter unit, the duplexer comprising:

a solid block of dielectric material having a top surface, a bottom surface, and at least first and second side surfaces;

an isolated antenna electrode on said solid block;

an isolated input electrode on said block spaced apart from the antenna electrode along a length of said block;

a first group of through-hole resonators extending from said antenna electrode to said input electrode;

an isolated output electrode on said block spaced apart from the antenna electrode along a length of said block;

a second group of through-hole resonators extending from said antenna electrode to said output electrode;

a local ground conductive layer on said block; and an electrode metallization pattern on said block, said metallization pattern being formed of a plurality of unmetallized recessed areas and a plurality of raised metallized areas and wherein none of said plurality of recessed areas extends over the combination of said top surface and both said first side surface and said second side surface and wherein at least one of said plurality of recessed areas extends over portions of said top surface and portions of said first side surface.

* * * * *